United States Patent
Makurin et al.

(10) Patent No.: US 11,791,535 B2
(45) Date of Patent: Oct. 17, 2023

(54) NON-GALVANIC INTERCONNECT FOR PLANAR RF DEVICES

(71) Applicant: SAMSUNG ELECTRONICS CO., LTD., Suwon-si (KR)

(72) Inventors: Mikhail Nikolaevich Makurin, Moscow (RU); Elena Aleksandrovna Shepeleva, Moscow (RU); Chongmin Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 94 days.

(21) Appl. No.: 17/487,426

(22) Filed: Sep. 28, 2021

(65) Prior Publication Data

US 2022/0102835 A1 Mar. 31, 2022

(30) Foreign Application Priority Data

Sep. 28, 2020 (RU) .............................. 2020131751
Apr. 6, 2021 (KR) ........................ 10-2021-0044803

(51) Int. Cl.
*H01Q 1/22* (2006.01)
*H01L 23/498* (2006.01)
(Continued)

(52) U.S. Cl.
CPC ............. *H01Q 1/2283* (2013.01); *H01Q 1/52* (2013.01); *H05K 1/0242* (2013.01)

(58) Field of Classification Search
CPC .......... H01Q 1/2283; H01Q 1/22; H01Q 1/38; H01Q 1/52; H01Q 21/00; H01Q 21/0093;
(Continued)

(56) References Cited

U.S. PATENT DOCUMENTS 5,936,584 A 8/1999 Lawrence et al.
8,592,957 B2 * 11/2013 Wakabayashi .......... H01L 23/66
257/659
(Continued)

FOREIGN PATENT DOCUMENTS

JP 2012-109316 6/2012
KR 10-2010-0051270 5/2010
(Continued)

OTHER PUBLICATIONS

International Search Report and Written Opinion dated Jan. 4, 2022 in corresponding International Application No. PCT/KR2021/013276.

(Continued)

*Primary Examiner* — Tho G Phan
(74) *Attorney, Agent, or Firm* — Nixon & Vanderhye P.C.

(57) ABSTRACT

A radio frequency (RF) system including first and second planar RF devices coupled by non-galvanic interconnect. According to various embodiments, a first RF device and a second RF device are separated by a dielectric layer, each of the first and second RF devices including a plurality of pads disposed on surface and surrounded by a common electrode, the common electrode configured as a grounded metal shield, wherein pads of the first RF device and pads of the second RF device face each other to provide capacitive coupling between the pads. The disclosure may reduce complexity and size of the system, and offer more reliable and easily producible interconnection between elements of the RF system.

14 Claims, 3 Drawing Sheets

(51) Int. Cl.
*H01Q 1/52* (2006.01)
*H05K 1/02* (2006.01)

(58) Field of Classification Search
CPC ........ H01Q 21/06; H05K 1/02; H05K 1/0242; H05K 1/0243; H05K 1/0251; H05K 1/0298; H05K 1/14; H05K 1/144; H05K 1/18; H01L 21/48; H01L 23/498
See application file for complete search history.

(56) References Cited

U.S. PATENT DOCUMENTS

| | | | | |
|---|---|---|---|---|
| 9,112,263 | B2* | 8/2015 | Pagani | H01Q 1/2225 |
| 9,256,773 | B2* | 2/2016 | Finn | G06K 19/0723 |
| 11,107,757 | B2* | 8/2021 | Ganesan | H01L 23/49816 |
| 11,522,267 | B2* | 12/2022 | Smith | G06K 19/0723 |
| 11,557,823 | B2* | 1/2023 | Charaabi | H05K 1/0237 |
| 2002/0192856 | A1 | 12/2002 | Halope et al. | |
| 2009/0289869 | A1 | 11/2009 | Babakhani et al. | |
| 2012/0146209 | A1 | 6/2012 | Hu et al. | |
| 2013/0082363 | A1 | 4/2013 | Zhao et al. | |
| 2013/0099006 | A1 | 4/2013 | Hong et al. | |
| 2014/0140031 | A1 | 5/2014 | Fujita et al. | |
| 2014/0320205 | A1 | 10/2014 | Lyalin et al. | |
| 2015/0325925 | A1 | 11/2015 | Kamgaing et al. | |
| 2015/0381229 | A1 | 12/2015 | Tzanidis et al. | |
| 2017/0077582 | A1 | 3/2017 | McCormack et al. | |
| 2017/0125895 | A1* | 5/2017 | Baks | H01Q 19/10 |
| 2017/0345761 | A1 | 11/2017 | Yu et al. | |
| 2019/0333382 | A1 | 10/2019 | Heyl et al. | |
| 2019/0334232 | A1 | 10/2019 | Ha et al. | |
| 2020/0259240 | A1 | 8/2020 | Moallem | |
| 2020/0411959 | A1* | 12/2020 | Ryu | H01Q 9/0407 |

FOREIGN PATENT DOCUMENTS

| | | |
|---|---|---|
| KR | 10-1833037 | 2/2018 |
| KR | 10-1888399 | 8/2018 |
| WO | 2018/097556 | 5/2018 |

OTHER PUBLICATIONS

Examination Report dated Mar. 19, 2021 in counterpart Russian Patent Application No. 2020131751/28(057624).

* cited by examiner

NON-GALVANIC INTERCONNECT FOR PLANAR RF DEVICES

CROSS-REFERENCE TO RELATED APPLICATIONS

This application is based on and claims priority under 35 U.S.C. § 119 to a Russian patent application serial no. 2020131751, filed on Sep. 28, 2020, and a Korean Patent Application No. 10-2021-0044803, filed on Apr. 6, 2021, in the Korean Intellectual Property Office, the disclosures of which are incorporated by reference herein in their entireties.

BACKGROUND

Field

The disclosure relates to radio engineering, and for example, to an RF system including two planar RF devices coupled via non-galvanic interconnect.

Description of Related Art

Currently, mm-wave antennas are continuously expanding their applications in various fields, for example, in communications systems of new and promising data transmission standards such as 5G (28 GHz), WiGig (60 GHz), Beyond 5G (60 GHz), 6G (subTHz range), long-distance wireless power transmission, LWPT (24 GHz), automotive radar systems (24 GHz, 79 GHz), etc.

In these applications, the following may be imposed upon antenna arrays to ensure their mass production and operation:
- precise assembling of radio frequency integrated circuit (RFIC);
- low losses of interconnections;
- cheap and compact structure;
- simple assembling procedure;
- compact power supply system;
- high efficiency, etc.

Existing techniques use a galvanic contact to connect RFIC with mm-wave antenna array (antenna) and to mount them onto a printed circuit board. Typical examples of the galvanic contact include BGA (ball grid array) and flip-chip (surface mount method). Flip-chip may also be referred to as C4 (controlled collapse chip connection).

BGA may refer to a type of surface-mount packaging used for mounting integrated circuits on a carrier of a printed circuit board (PCB).

Flip chip may refer to a method for packaging integrated circuits, in which chip is mounted on bumps provided directly on the chip pads.

These approaches have problems of damaging galvanic connections e.g. between the components being connected (RFIC and antenna or RFIC and PCB) due to vibration, thermal expansion, mechanical stress, etc. Furthermore, inaccurate assembly or uneven thermal expansion of connected components when they are heated may cause shifting of component pads relative to each other. This changes the RF transition parameters between the components being connected and increases losses, or causes contact failure. Thus, the existing techniques demonstrate low reliability and accuracy, especially for microwaves.

At the same time, the desire to increase functionality per unit volume and weight of equipment dictates increasing the number of switching leads, decreasing the length of conducting paths and reducing the contact spacing, which again increases the requirements for precision and reliability of contacts between components in RF equipment.

Another disadvantage of the above approaches is that after soldering a chip, it is very difficult to detect soldering defects. It is common practice to solve this problem using x-rays or special microscopes, but these are expensive.

US patent publication 20170345761 A1 discloses a package structure comprising a first die, a second die, the third die, a molding compound, a first redistribution layer, an antenna and conductive elements. The first die, the second die and the third die are molded in a molding compound. The first redistribution layer is disposed on the molding compound and is electrically connected to the first die, the second die and the third die. The antenna is located on the molding compound and electrically connected to the first die, the second die and the third die, wherein a distance of an electrical connection path between the first die and the antenna is smaller than or equal to a distance of an electrical connection path between the second die and the antenna and a distance of an electrical connection path between the third die and the antenna. The conductive elements are connected to the first redistribution layer, wherein the first redistribution layer is located between the conductive elements and the molding compound. However, galvanic connections between control integrated circuit and antenna PCB are sensitive to the assembling quality, which can affect operation of the device.

US patent publication 20090289869 A1 discloses an antenna structure for coupling electromagnetic energy between a chip and an off-chip element, including a first resonant structure disposed on or in a chip. The first resonant structure is configured to have a first resonant frequency. The antenna structure also includes a second resonant structure disposed on or in an off-chip element. The second resonant structure is configured to have a second resonant frequency substantially the same as the first resonant frequency. The first resonant structure and the second resonant structure are mutually disposed within a near field distance of each other to form a coupled antenna structure that is configured to transfer electromagnetic energy between the chip and the off-chip element. The electromagnetic energy is transferred at a selected wavelength in a wavelength range from microwave to sub-millimeter wave. Non-galvanic interconnect between the elements comprises substantially inductive coupling by two coil-resonators, having a narrow-band. The structure does not support mm-wave operation.

International patent publication WO 2018/097556 A1 discloses an antenna device including: an antenna substrate, on which an array antenna including at least one radiation element is arranged; and a cover spaced apart from the antenna substrate at least a predetermined distance and further including at least one relay radiation element arranged to correspond to the at least one radiation element. The radiation elements have quite large size to provide electromagnetic wave radiation. The device does not solve the problem of co-integration of RFIC and antenna and is prone to process problems of flip-chip and BGA techniques.

Therefore, there is a need to provide a technique which can ensure a simple, reliable, easily producible non-galvanic interconnect between elements of an RF system, for example, between Radio-Frequency Integrated Circuit (RFIC) and antenna array.

SUMMARY

The disclosure addresses at least some of the above problems.

Embodiments of the disclosure provide a simple, compact, reliable, efficient and easily producible non-galvanic interconnect of elements of an RF system, having wide operating bandwidth.

According to an example embodiment of the present disclosure, a a radio frequency (RF) system is provided, the RF system including: a first RF device and a second RF device separated by a dielectric layer, each of the first RF device and the second RF device including a plurality of pads disposed on a surface thereof and surrounded by a common electrode, the common electrode configured as a grounded metal shield, wherein pads of the first RF device and pads of the second RF device face each other to provide capacitive coupling between the pads and the common electrodes, and wherein the radio frequency system is configured to transmit signal between the RF devices through the pads.

According to an example embodiment of the present disclosure, the radio frequency system further comprises: at least one printed circuit board disposed between the first RF device and the second RF device, the at least one printed circuit board having, on opposite surfaces, pads aligned with pads of the first RF device and the second RF device, respectively, and pads on opposite surfaces of said at least one printed circuit board are interconnected by vias and transmission lines.

Embodiments of the disclosure provide a simple, compact, reliable, efficient and easily producible non-galvanic interconnect of elements of an RF system, having wide operating bandwidth.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Embodiments of the disclosure are not limited to those described herein, various embodiments may include various changes in form and detail that will be apparent to those skilled in the art without departing from the true spirit and full scope of the disclosure The present disclosure substantially replaces a galvanic contact between two planar RF devices (e.g. antenna PCB and carrier control PCB with RFIC).

Generally, the disclosure relates to a radio frequency (RF) system including two planar RF devices coupled through non-galvanic interconnect. The disclosure describes the transition between RF path parts made on two planar structures, which can be produced with different manufacturing technology. In various example embodiments, the RF system include, for example, and without limitation, at least one of the following:

connection of antenna path parts made on different PCBs by virtue of structural efficiency;

co-integration of an antenna array and a phase control system of the elements;

co-integration of power distribution elements (dividers) and a system of emitters, made by different technologies, etc.

Figure 1:
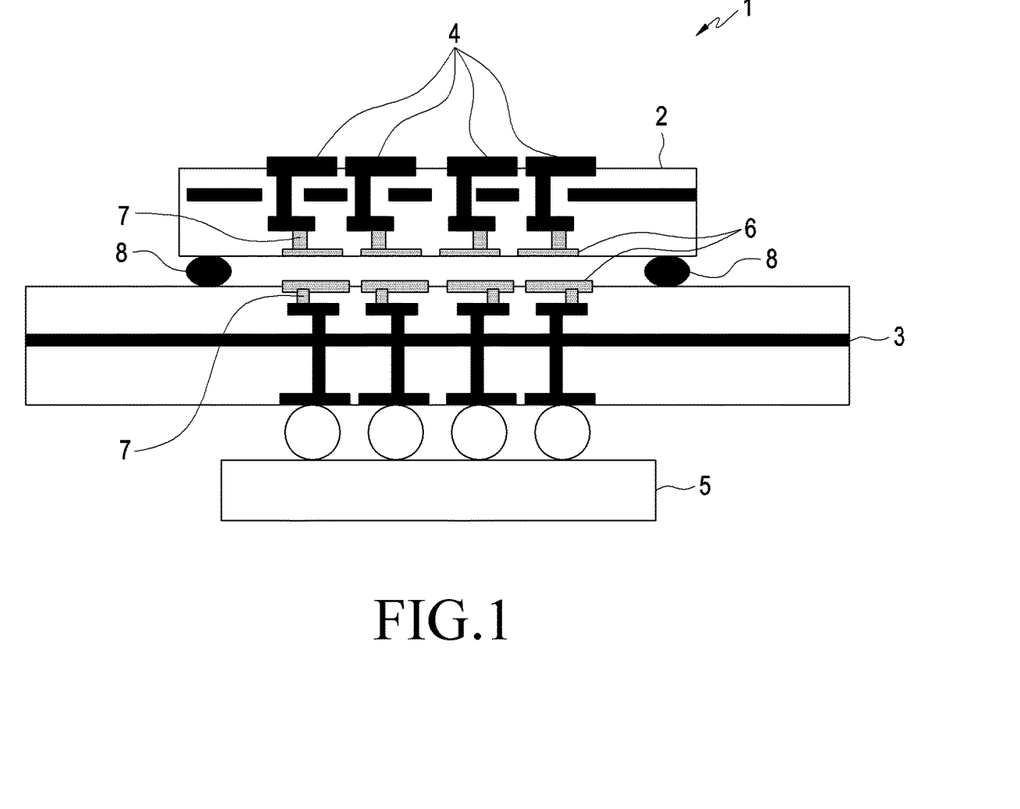
FIG. 1 is a cross-sectional view illustrating an example RF system according to various embodiments.

In an example embodiment illustrated in FIG. 1, the RF system may include, for example, an antenna device (1) including two printed circuit boards (PCB) (2, 3) separated by a dielectric layer, the first PCB (2) comprising part of the RF path of the system and an antenna emitter or a set of antenna emitters (antenna array) (4), and the second PCB (3) comprising another part of the RF path of the system and a control RFIC chip (5). Both PCBs (2, 3) include a plurality of pads (6) disposed on surface and surrounded by a common electrode; pads of the first PCB (2) and pads of the second PCB (3) are opposite and face each other, e.g., the pads (6) and the common electrode of the first PCB (2) are disposed above respective pads (6) and common electrode of the second PCB (3). Thus, the pads (6) and common electrodes implement capacitive coupling with each other. Moreover, pads of the first PCB (2) may be connected to the RF path of the first PCB (2) through vias (7) and pads (6) of the second PCB (3) are similarly connected to the RF path of the second PCB (3) through vias (7) and ultimately form a joint RF path. Thus, the signal is transmitted to and from the pads (6) through vias (7).

In an example embodiment, the non-galvanic interconnect is configured to operate in millimeter and sub-millimeter wavelength ranges.

The gap between PCBs may, for example, be provided by spacers (8) and filled with air. The spacers (8) can be of any shape to provide the required gap size. The spacers (8) can be made of a dielectric and disposed anywhere between said PCBs. The spacers (8) can be made of a conductive material and may be spaced away from the pads. The gap between PCBs (and other components of the device) can be filled with a compound to protect it from external effects. In an embodiment, the gap between PCBs can be formed of a solid dielectric that can also serve as a bond between the PCBs. In accordance with the present disclosure, the dielectric layer between PCBs prevents and/or reduces galvanic contact between parts of the system RF path, and thus various embodiments of the present disclosure avoid disadvantages inherent in the galvanic connection.

The transition characteristics in accordance with the present disclosure (minimum and/or reduced loss, maximum and/or improved operating bandwidth) may be achieved with minimum producible gap. This will provide maximum capacitance and minimum transition impedance. If the gap is filled with air, its height may not be greater than half the diameter or half the maximum longitudinal size of the pad, which will provide electrical capacitance between the pads sufficient to allow matching in the band. If the gap is filled with a dielectric with a dielectric constant ε>1, the height of the gap may be increased.

Figure 2A:
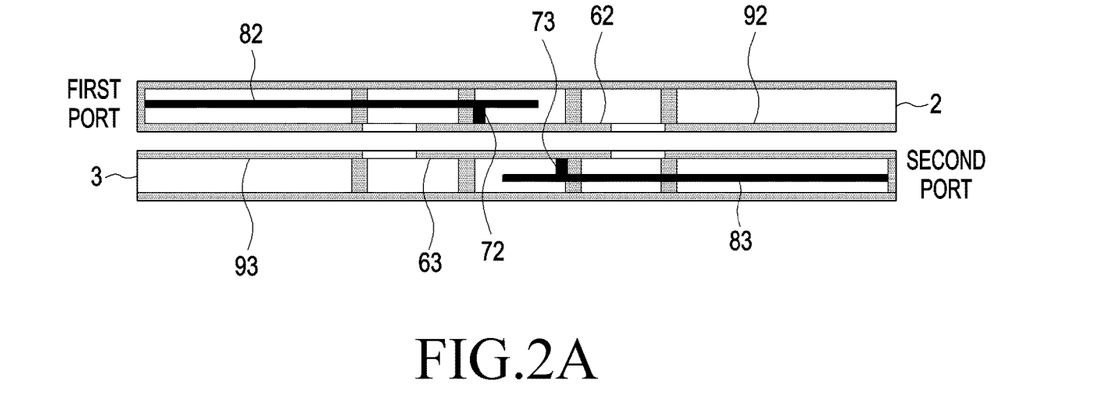
FIG. 2A is a cross-sectional view illustrating part of an RF system, including one pad on each PCB, according to various embodiments.

FIG. 2A is a cross-sectional view of a part of an RF system according to various embodiments. As illustrated in FIG. 2A, the RF system may include, one pad on each of the PCBs, e.g., cross section of a single non-galvanic transition in the RF system. Pad (62) on the surface of a first PCB (2) is disposed above pad (63) on the surface of a second PCB (3). The pad (62) on the surface of the first PCB (2) is surrounded by a common electrode (92) and is separated from it by a gap. The pad (63) on the surface of the second PCB (3) is surrounded by a common electrode (93) and is separated from it by a gap. Moreover, the pad (62) is connected by via (72) and transmission line (82) to a first port, from which signal may be received in an embodiment. Similarly, the pad (63) is connected by via (73) and a transmission line (83) to a second port where the signal may be transmitted.

It should be noted that via (72) and via (73) in FIG. 2A are shifted relative each other. In an an embodiment, the vias may be aligned.

The pads (62, 63) may be aligned (for example, coaxially) or shifted relative to each other.

Surfaces of PCBs are separated by a dielectric layer and have substantially no galvanic connection, thus forming a non-galvanic RF interconnect.

Interface of the connection in FIG. 2A comprises, in each of the PCBs, a transmission line, a common electrode, a matching transformer (described in greater detail below), vias between the transmission line and a signal electrode layer, and a pad. Pads on each PCB include capacitively coupled electrodes.

In FIG. 2A, the transmission line is illustrated, by way of non-limiting example, as a symmetrical transmission line formed between two grounded metallization layers. In general, the transmission line can be of any type (as described below).

Each signal via may be surrounded by additional shielding vias that interconnect the grounded metallization layers to prevent and/or reduce parasitic radiation (leakage) through the substrate.

Figure 2B:
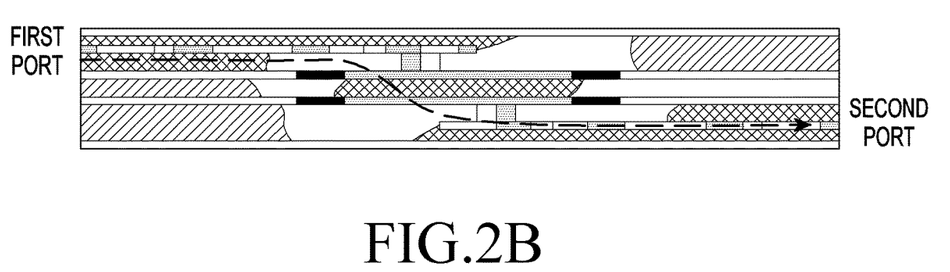
FIG. 2B is a cross-sectional view illustrating a direction of a signal in the part illustrated in FIG. 2A, according to various embodiments.

FIG. 2B is a diagram illustrating an example of the direction of signal in part of the antenna device shown in FIG. 2A, and distribution of electromagnetic field in this part according to various embodiments. As shown in FIG. 2B by broken line, signal goes from the first port through the transmission line (82), via (72), pad (62), dielectric layer, pad (63), via (73) and transmission line (83) to the second port. In these conditions, signal transmission occurs with minimal loss. It should be noted that signal can be transmitted in the opposite direction in the same way.

Figure 3:
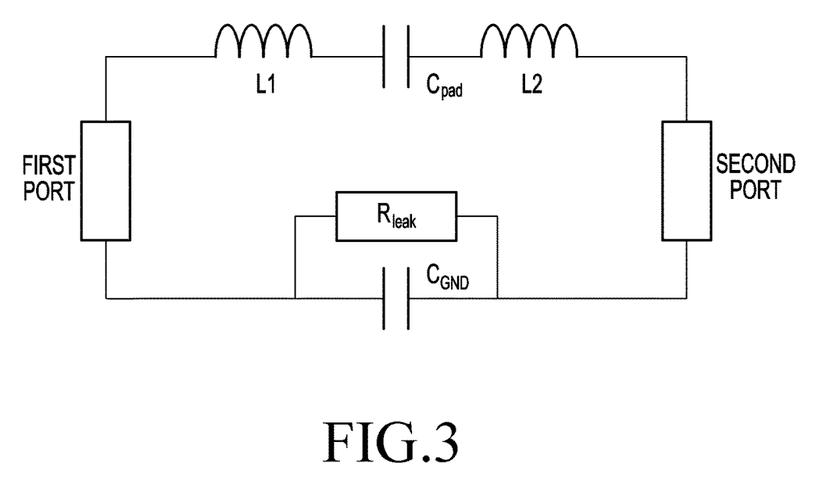
FIG. 3 is an equivalent circuit diagram of the part of RF system shown in FIG. 2A, according to various embodiments.

FIG. 3 is an equivalent circuit diagram illustrating the part of the RF system shown in FIG. 2A according to various embodiments.

In FIG. 3, L1 and L2 indicate inductance of vias and transmission line part in the first PCB and the second PCB, respectively; $C_{pad}$ refers to the capacitance between the two pads, $C_{GND}$ refers to the capacitance in the gap between common electrodes around the pads, disposed on the first PCB and the second PCB, respectively. $R_{leak}$ refers to leakage impedance in the dielectric layer.

L1 and L2 may be adjusted by selecting the via diameter and the width of the transmission line part.

Having a relatively large ground area (and hence capacitance) prevents and/or reduces interconnect from electromagnetic (EM) power leakage into the gap between PCB surfaces.

For proper operation in the part shown in FIG. 2A, resonance condition with required central frequency should be met. Parameters of the components included in said part may be selected in view of this condition.

Simulation 1

Simulation of operation of a single transition in accordance with the present disclosure to transmit signal with 140 GHz frequency (appropriate for 6G) was performed. According to simulation data, vias in opposite PCBs were disposed in center of the pad (e.g., opposite), 50 μm gap between the PCBs was filled with dielectric with ε=2.25. The simulation illustrated that signal loss in the transition is about 1.2 dB, and relative operating bandwidth of the transition is about 15%. The relative operating bandwidth is calculated as the ratio of the operating bandwidth to the center frequency of the $\Delta F/F_0$ range.

Therefore, the present disclosure allows a non-galvanic interconnect to be provided between the control component and the antenna array, and, consequently, it can increase reliability, efficiency and adaptability to manufacture of the antenna device, reduce complexity and duration of assembling, which is advantageous for the cost of the resulting device. The antenna device in accordance with the present disclosure has a wide operating bandwidth, small size and reduced losses.

It should be noted that arrangement of vias relative to respective pad may affect the distribution of electromagnetic field at each transition. For example, if length of the pad perimeter is about half the wavelength of the slot line (pad and common electrode are electrodes), then properties of the transition loaded with such a slot line change drastically due to possible transformation of open transition into closed one over the transmission line with such electrical length (due to symmetry, half the perimeter wavelength will load the port with two quarter-wave (¼) wavelength segments), which will effectively load the feeding line with low resistance and lead to a mismatch. More complex effects are also possible due to the fact that the complete transition structure will comprise a line with four electrodes (two slot lines separated by air gap), and it is almost impossible to achieve geometric symmetry of the structure (symmetry with respect to the axis normal to the plane of electrodes), which can lead to excitation of various types of waves in the structure.

The variety of possible options for relative position of vias in the transition, may include the following:
both vias being shifted in opposite directions;
both vias being disposed in the center;
both vias being shifted in the same direction.

Simulation 2

Additional simulation of a single transition in accordance with the present disclosure in V band (40-75 GHz) and W band (75-110 GHz) was performed. Single transition in this simulation differs from single transition in Simulation 1 described above in that the vias are shifted in opposite directions. The simulation has shown that signal loss in this transition is also about 1.2 dB, while relative operating bandwidth of the transition is above 40%.

Simulation 3

Various options for arrangement of transmission lines and shifting of vias in the transition were also simulated. The following situations were simulated, while not excluding other positions of vias and transmission lines relative to the transition:

two transmission lines disposed on opposite sides of the transition, two vias shifted to opposite sides of the transition, two transmission lines disposed on one side of the transition, two vias shifted to the same side of the transition, two transmission lines disposed on one side of the transition, two vias disposed in the center, two transmission lines disposed on one side of the transition, two vias shifted to the opposite side.

The simulation has shown that position of vias has a significant effect on s-parameters of the transition. As explained above, the worst match (in the simulation) corresponds to vias and feeding lines positioned on one side of the pad, where the unloaded side of the transition mismatches transition ports through quarter-wave sections, and the best match corresponds to vias and transmission lines positioned on opposite sides of the transition, when one of the ports loads the line, and its impedance at the opposite end increases and stops mismatching the opposite port.

However, geometry of a particular transition developed (selected materials of PCBs, sizes of transition elements, types of used transmission lines) may affect its parameters, and parameters of shifting the vias can give different results from those described above.

Figure 4:
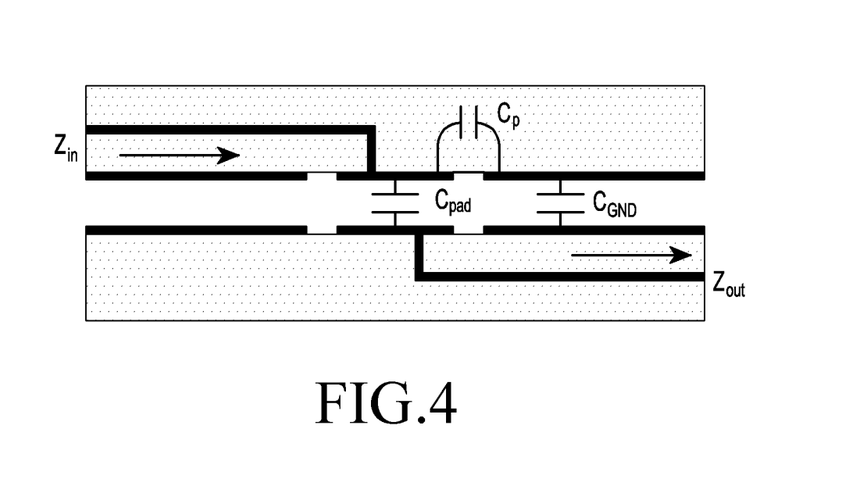
FIG. 4 is a diagram illustrating example capacitive couplings between components of a single transition of the RF system according to various embodiments.

It should be taken into account that at the break point of a signal line, parasitic capacitance $C_p$ arises in the transition between the signal line and ground (see FIG. 4). This decreases the transition impedance. To compensate for the impedance decrease at the end of the signal line and to return the impedance to initial impedance values $Z_{in}$ and $Z_{out}$ on the input and output port, respectively, a matching transformer (matching element) may be included at the end of the transmission line. In an example embodiment, the matching transformer is a quarter-wave transformer configured as an end part of the transmission line, having a width exceeding that of the width of the rest of the transmission line. Thus, the vias are connected to the quarter-wave transformer, which is the end part of the transmission line. Provision of the transformer makes it possible to match the transition with the transmission line impedance (e.g. 50 Ohm), making the transition universal and enabling its use at any point in the antenna path.

The best position of the matching transformer (according to the simulation) is close to the transition. The via and pad can also adjust the transition impedance. However, in most designs (for example, for about 60 GHz range) a matching transformer in the transmission line is more convenient for this purpose, since diameter of vias is selected from standard drill values and may be larger or smaller than the required values.

In an embodiment, the present disclosure may be applied to "antenna-on-chip" architecture. In this case, the antenna is disposed directly on the control component chip. Instead of the second PCB containing the control component, this example embodiment directly uses the chip of the control component. Pads are formed on the chip, and, when assembled, they are disposed coaxially above pads of the first PCB containing the antenna array. This may further simplify the antenna device design.

Figure 5:
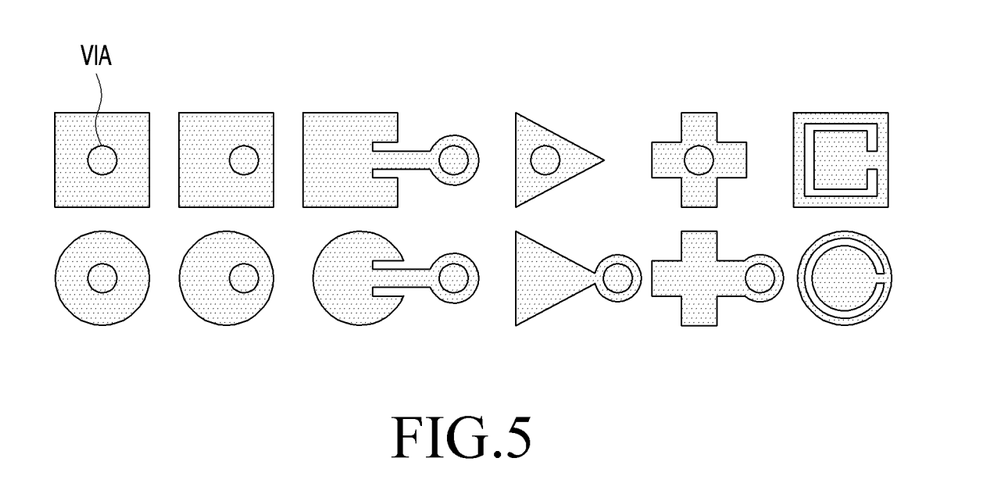
FIG. 5 is a diagram illustrating various example geometric shapes of pads and locations of vias according to various embodiments.

In the present disclosure, various shapes of pads and multiple variants of relative positions of vias can be used depending on structural, functional and other requirements for the antenna device. FIG. 5 illustrates various example shapes of pads and positions of vias.

It should be noted that the transmission line in accordance with the present disclosure may be implemented as one of the following types: symmetrical microstrip line (as disclosed in the above embodiments), non-symmetrical microstrip line, coaxial line, substrate integrated waveguide (SIW), waveguide with and without dielectric filling, coplanar line, grounded coplanar line, etc.

In an embodiment, transmission line may be missing, e.g. when RFIC bump is used as the pad per se.

Elements comprising a single transition on each PCB (transmission line, via, pad) can have different size.

In accordance with an embodiment, the RF system may have at least one additional PCB disposed between the first PCB and the second PCB, said at least one additional PCB having pads on both its surfaces, which are aligned with pads of the first and second PCB, respectively. Pads on opposite surfaces of said at least one additional PCB are interconnected by vias and transmission line. The arrangement of pads, vias and transmission lines in said at least one additional PCB is similar to the arrangement of these elements in the first PCB and the second PCB. This example embodiment amy expand the ability of adapting the present antenna device to various structural, functional and other requirements at the stage of development and production.

Simulation 4

A simulation of mutual influence between two neighboring single transitions in accordance with the present disclosure was also performed. With 1 mm spacing between neighboring single transitions in V band and W band, the coupling efficiency between neighboring transitions is less than −23 dB. With 0.6 mm spacing between neighboring single transitions for 140 GHz operating frequency, the coupling efficiency is less than −26 dB. These results suggest that the array of such transitions can be used for signal transmission.

Simulation 5

A simulation of stability of characteristics of the described transition while changing some of its geometric parameters, such as the gap height, and displacing PCBs (and pads) relative to each other was also performed. Such changes may result from inferior accuracy of PCB fabrication and assembly. Usually, the manufacturer guarantees accuracy better than 10% for compliance with the specified layer thickness (thickness of spacers) and e.g. accuracy of etching the pads of transition vias. These parameters have been verified in the simulation.

Simulation of operation of the transition in 57-71 GHz band with the first PCB shifted against the second PCB by 10% relative to the size of pads along and across feeding lines showed that this band remains operational even with the described shift of the PCBs against each other. Given the wide band operation of the described transition, for some systems this shift (or even more than 10% relative to the size of pads, depending on the required operating band of the device) may be factored into the transition structure.

Simulation of operation of the described transition while changing the gap height by 20% relative to the specified height showed that the transition matching band remains stable with such changes.

Therefore, the present disclosure provides a simple, compact, reliable, efficient and easily producible antenna device having a wide operating bandwidth.

The present disclosure may be used in wireless communication systems of advanced standards 5G, WiGig, Beyond 5G, 6G, etc.

When used in radar devices in robotics and autonomous vehicles, embodiments of the present disclosure may be employed to detect/avoid obstacles.

The present disclosure may also find application in wireless power transfer systems such as LWPT of all types: outdoor/indoor, automotive, mobile, etc. Therewith, high efficiency of power transfer is ensured in all scenarios.

It should be understood that while terms such as "first", "second", "third" and the like may be used herein to describe various elements, components, regions, layers and/or sections, these elements, components, regions, layers and/or sections should not be limited by these terms. The terms may be used simply to distinguish one element, component, region, layer or section from another element, component, region, layer or section. Thus, the first element, component, region, layer or section may be referred to as a second element, component, region, layer or section without departing from the scope of the present disclosure. In the present description, the term "and/or" includes any and all combinations of one or more of the respective listed reference numerals. Elements mentioned in the singular do not exclude the plurality of elements, unless otherwise specified.

Functionality of an element specified in the description or claims as a single element can be implemented in practice by several components of the device, and conversely, functionality of elements specified in the description or in the claims as several separate elements can be implemented in practice by a single component.

The disclosure does not teach particular software or hardware to implement units in the drawings, but one skilled in the art will appreciate that the spirit of the disclosure is not limited to particular software or hardware, therefore, any existing software and hardware may be used to implement the disclosure. For example, the hardware can be implemented in one or more specialized integrated circuits, digital signal processors, digital signal processing devices, programmable logic devices, user programmable gate arrays, processors, controllers, microcontrollers, microprocessors, electronic devices, and other electronic modules configured to perform functions described in this document, a computer or a combination of the above.

Although various example embodiments have been described in detail and shown in the accompanying drawings, it should be appreciated that such embodiments are merely illustrative and not intended to limit the broader disclosure, and that the disclosure is not be limited to the particular arrangements and structures shown and described, since various other modifications may be apparent to those skilled in the art.

Elements mentioned in the singular do not exclude the plurality of elements, unless otherwise specified.

The features mentioned in various dependent claims, as well as the embodiments disclosed in various parts of the description, can be combined to achieve beneficial effects, even if the possibility of such a combination is not explicitly disclosed.

As described above, according to an example embodiment of the present disclosure, a radio frequency (RF) system including two planar RF devices separated by a dielectric layer is provided, the system comprising: a first RF device and a second RF device, each RF device including a plurality of pads disposed on at least one surface and surrounded by a common electrode configured as a grounded metal shield, wherein pads of the first RF device and pads of the second RF device face each other and are configured to be capacitively coupled between the pads and the common electrodes, and wherein the radio frequency system may be configured to transmit a signal between the RF devices through the pads.

In an example embodiment of the radio frequency system, the first RF device may include a first printed circuit board including a part of an RF path of the radio frequency system, the part of RF path including transmission lines connected to the pads through vias and connected to the common electrode.

In an example embodiment of the radio frequency system, the second RF device may include a second printed circuit board including another part of the RF path of the radio frequency system, the other part of the RF path including transmission lines connected to the pads through vias and connected to the common electrode.

In an example embodiment of the radio frequency system, the first RF device may include an antenna array, and the second RF device may include a control radio frequency integrated circuit (RFIC).

In an example embodiment of the radio frequency system, the vias may be shifted from the center of the pads.

In an example embodiment of the radio frequency systems, vias of the first RF device may be shifted relative to vias of the second RF device.

In an example embodiment of the radio frequency system, a matching transformer may be provided at the transmission line end that is in contact with the vias.

In an example embodiment of the radio frequency system, the matching transformer may include a quarter-wave transformer configured as a transmission line end section having a width exceeding a width of the transmission line.

In an example embodiment of the radio frequency system, pads of the first RF device and pads of the second RF device may be aligned with each other.

In an example embodiment of the radio frequency system, the transmission line may include at least one of: symmetrical microstrip line, non-symmetrical microstrip line, coaxial line, substrate integrated waveguide, waveguide with and without dielectric feeling, coplanar line, and grounded coplanar line.

According to an example embodiment, the radio frequency system may further comprise: at least one additional printed circuit board disposed between the first RF device and the second RF device, said at least one additional printed circuit board having, on opposite surfaces, pads aligned with pads of the first RF device and the second RF device, respectively, and pads on opposite surfaces of said at least one additional printed circuit board may be interconnected by vias and transmission lines.

In an example embodiment of the radio frequency system, the RF devices may be separated from each other by a layer of air, the gap between the RF devices being provided by spacers.

In an example embodiment of the radio frequency system, the spacers may be made of a dielectric.

In an example embodiment of the radio frequency system, the RF devices may be separated from each other by a layer of solid dielectric. While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. A radio frequency (RF) system comprising:
a first RF device and a second RF device separated by a dielectric layer, each of the first RF device and the second RF device including a plurality of pads disposed on a surface of the device, the pads being surrounded by a common electrode, the common electrode configured as a grounded metal shield, wherein pads of the first RF device and pads of the second RF device face each other to provide capacitive coupling between the pads and the common electrodes, and wherein the RF system is configured to transmit signals between the first RF device and the second RF device through the pads.

2. The radio frequency system according to claim 1, wherein:

the first RF device comprises a first printed circuit board including a part of an RF path of the radio frequency system, the part of the RF path part including transmission lines connected to the pads through vias and connected to the common electrode, the second RF device comprises a second printed circuit board including another part of the RF path of the radio frequency system, and the other part of the RF path including transmission lines connected to the pads through vias and connected to the common electrode.

3. The radio frequency system according to claim 2, wherein the first RF device comprises an antenna array, and the second RF device comprises a control radio frequency integrated circuit (RFIC).

4. The radio frequency system according to claim 2, wherein the vias are shifted relative to a center of the pads.

5. The radio frequency system according to claim 2, wherein vias of the first RF device are shifted relative to vias of the second RF device.

6. The radio frequency system according to claim 2, wherein a matching transformer is provided at an end of a transmission line that is in contact with the vias.

7. The radio frequency system according to claim 6, wherein the matching transformer comprises a quarter-wave transformer configured as a transmission line end section having a width greater than a width of the the transmission line.

8. The radio frequency system according to claim 2, wherein the transmission line includes at least one of: a symmetrical microstrip line, a non-symmetrical microstrip line, a coaxial line, a substrate integrated waveguide, a waveguide with dielectric filling, a waveguide without dielectric filling, a coplanar line, a grounded coplanar line.

9. The radio frequency system according to claim 1, wherein pads of the first RF device and pads of the second RF device are aligned with each other.

10. The radio frequency system according to claim 1, further comprising at least one printed circuit board disposed between the first RF device and the second RF device, the at least one printed circuit board including, on opposite surfaces, pads aligned with pads of the first RF device and the second RF device, respectively, wherein pads on opposite surfaces of the at least one printed circuit board are interconnected by vias and transmission lines.

11. The radio frequency system according to claim 1, wherein the RF devices are separated from each other by a layer of air, a gap between the RF devices being provided by spacers.

12. The radio frequency system according to claim 11, wherein the spacers comprise a dielectric.

13. The radio frequency system according to claim 1, wherein the RF devices are separated from each other by a layer of dielectric material.

14. The radio frequency system according to claim 13, wherein the dielectric material comprises a solid dielectric material.

* * * * *